United States Patent [19]
Stamoulis et al.

[11] Patent Number: 5,831,453
[45] Date of Patent: Nov. 3, 1998

[54] METHOD AND APPARATUS FOR LOW POWER DATA TRANSMISSION

[75] Inventors: Georgios I. Stamoulis, Campbell; Junji Sugisawa, Santa Clara; Michael Y. Zhang, Palo Alto, all of Calif.

[73] Assignee: Intel Corporation, Santa Clara, Calif.

[21] Appl. No.: 777,547

[22] Filed: Dec. 30, 1996

[51] Int. Cl.⁶ .................. H03K 19/0948; H03K 19/096
[52] U.S. Cl. ........................... 326/113; 326/98; 326/121; 327/403; 327/404
[58] Field of Search .................. 326/113, 95, 98, 326/112, 119, 121, 57–58, 17; 327/403–404, 374, 203, 208

[56] References Cited

U.S. PATENT DOCUMENTS

| | | | |
|---|---|---|---|
| 4,571,504 | 2/1986 | Iwamoto et al. | 327/404 |
| 4,577,124 | 3/1986 | Koike | 326/121 |
| 4,611,135 | 9/1986 | Nakayama et al. | 327/404 |
| 5,450,019 | 9/1995 | McClure et al. | 326/121 |

*Primary Examiner*—Jon Santamauro
*Attorney, Agent, or Firm*—Joseph R. Bond

[57] ABSTRACT

A method and apparatus for low power transmission of digital data. A low power data transmission circuit includes a pass gate having parallel-connected n and p-channel CMOS transistors that transmit input data. To reduce power in a first embodiment, a circuit disables the parallel-connected p-channel pass gate transistor except when the input data is high (logical 1). The p-channel pass gate transistor is needed to pass logical 1's without degradation. In the first embodiment, the n-channel pass gate transistor is enabled to transmit the input data on every clock cycle. In a second embodiment, the circuit disables the parallel-connected n-channel pass gate transistor except when the input data is low (logical 0). The n-channel pass gate transistor is needed to pass logical 0's without degradation. In this embodiment, the p-channel pass gate transistor is enabled to transmit the input data on every clock cycle. These low power data transmission circuits achieve substantial power savings by avoiding unnecessary charging and discharging of the pass gate transistors' gate capacitance on every clock cycle.

21 Claims, 5 Drawing Sheets

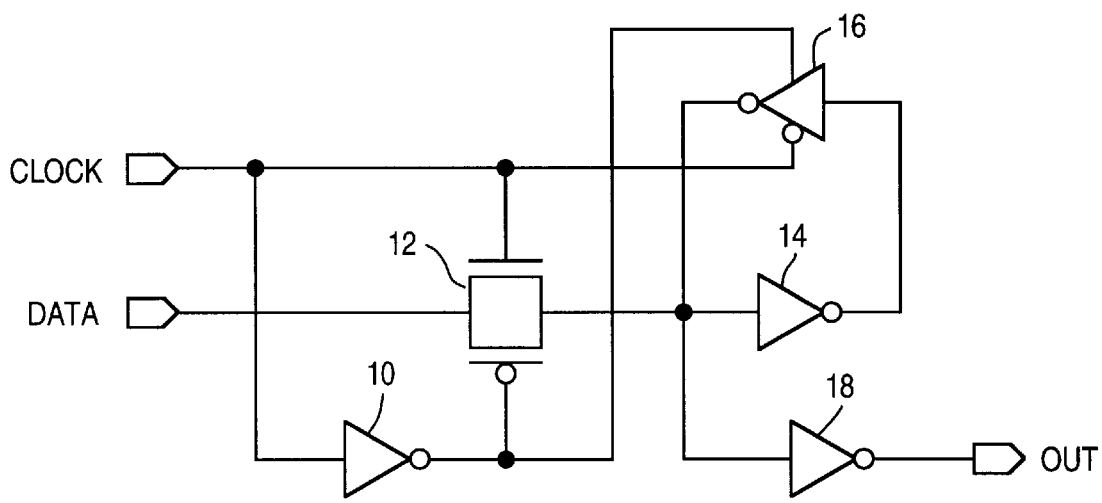
FIG_1A (PRIOR ART)
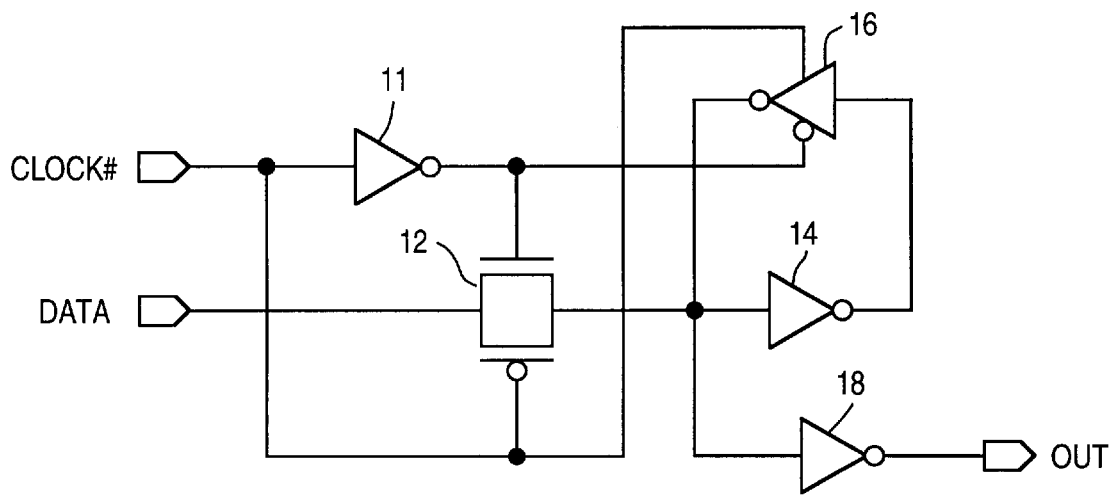
FIG_1B (PRIOR ART)

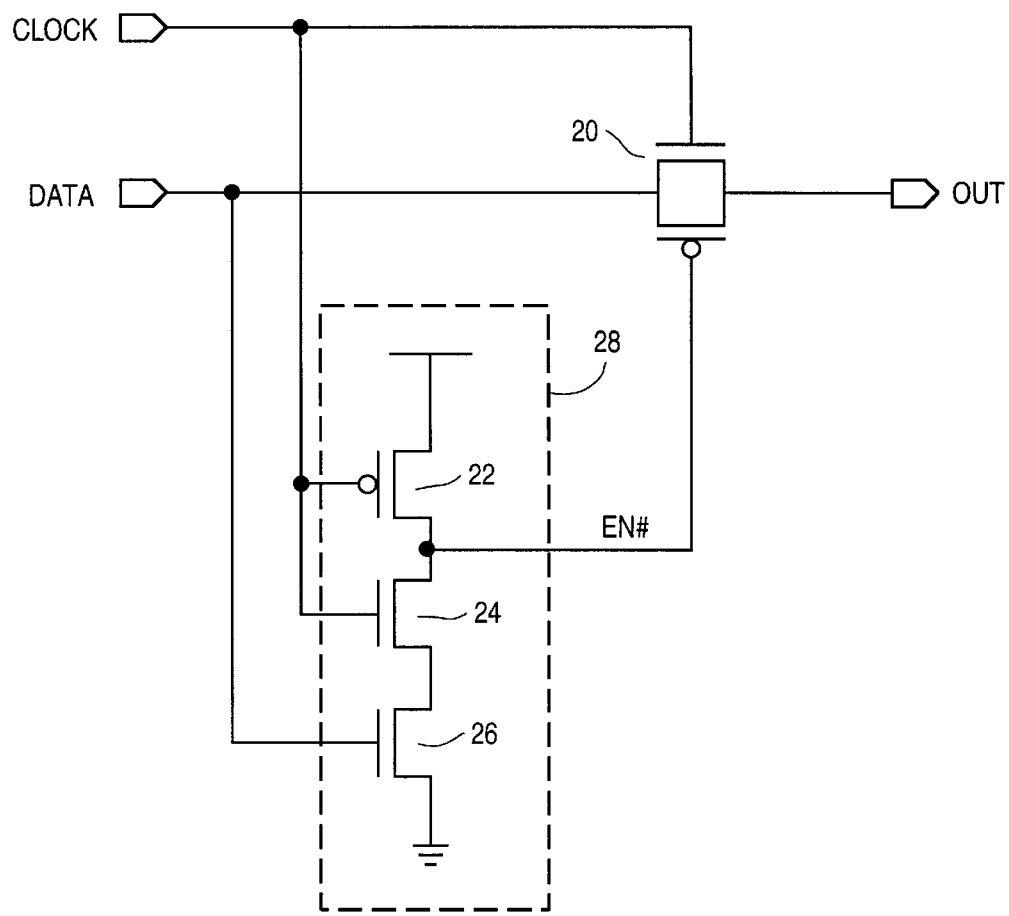
FIG_2A
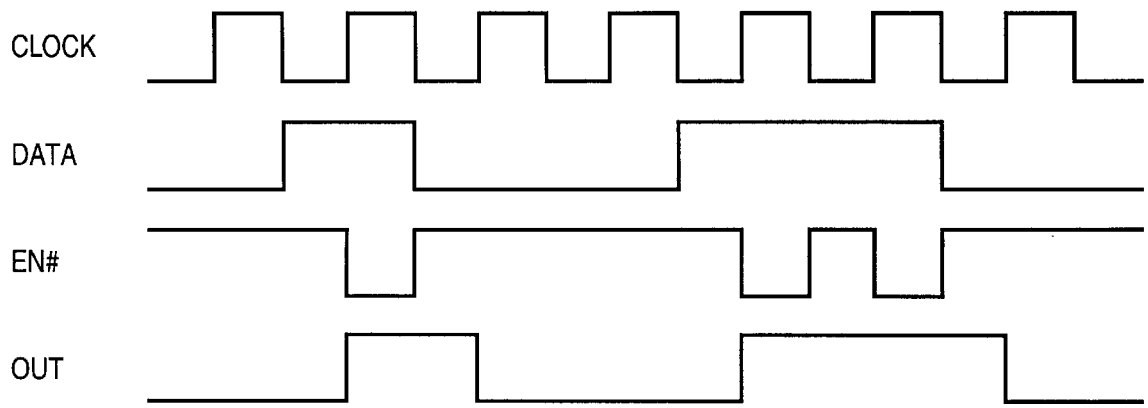
FIG_2B

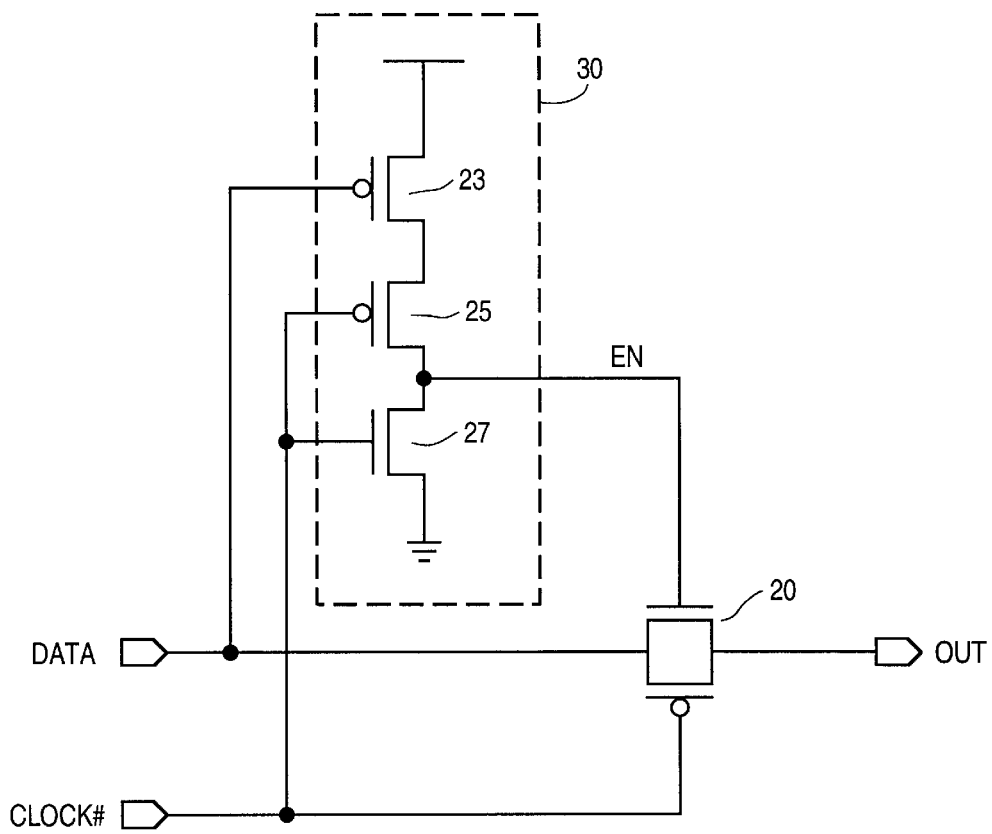
FIG_2C
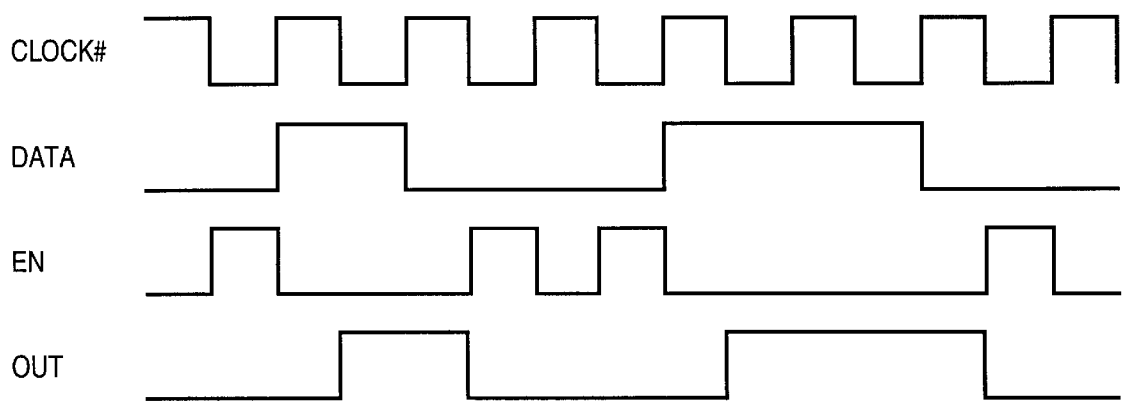
FIG_2D

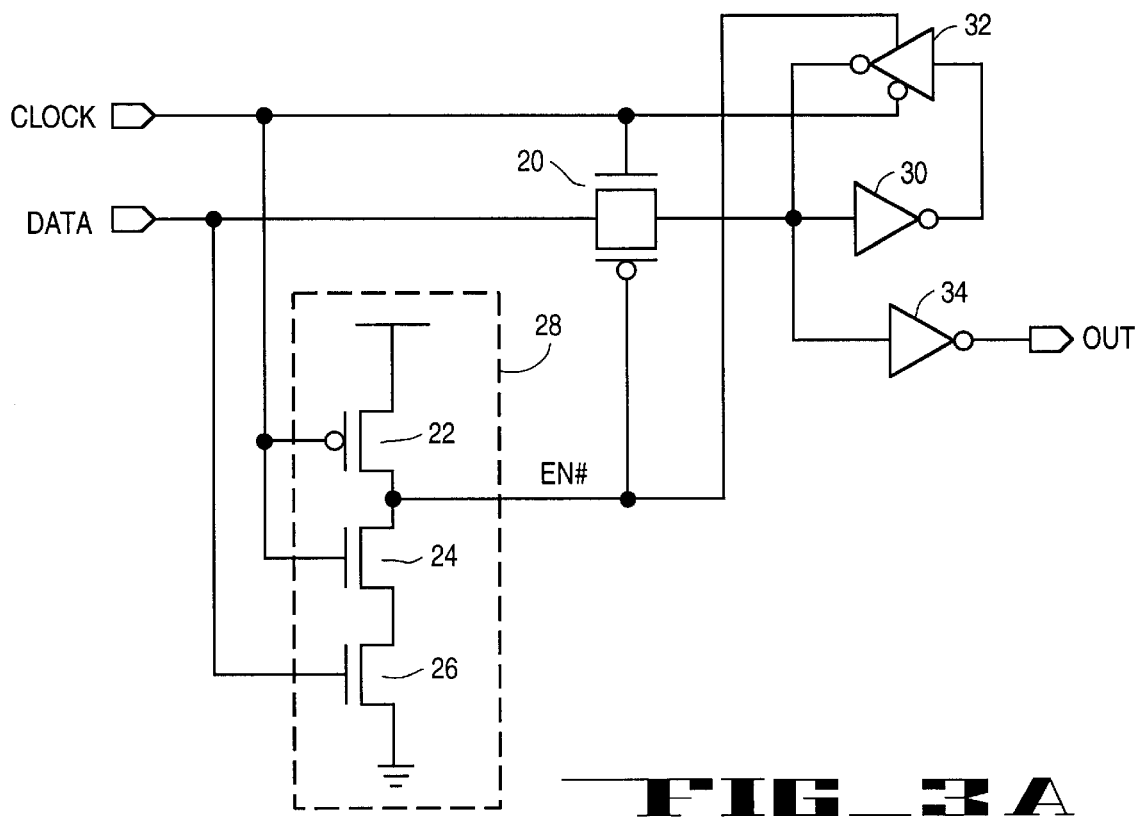
FIG_3A
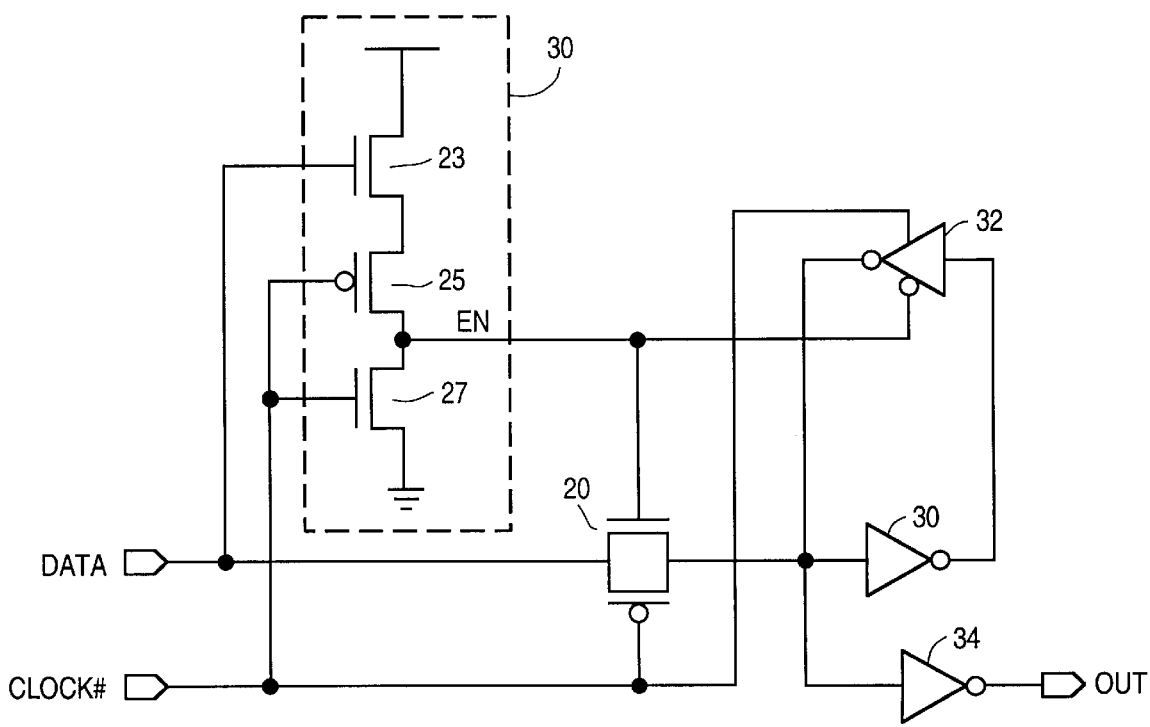
FIG_3B

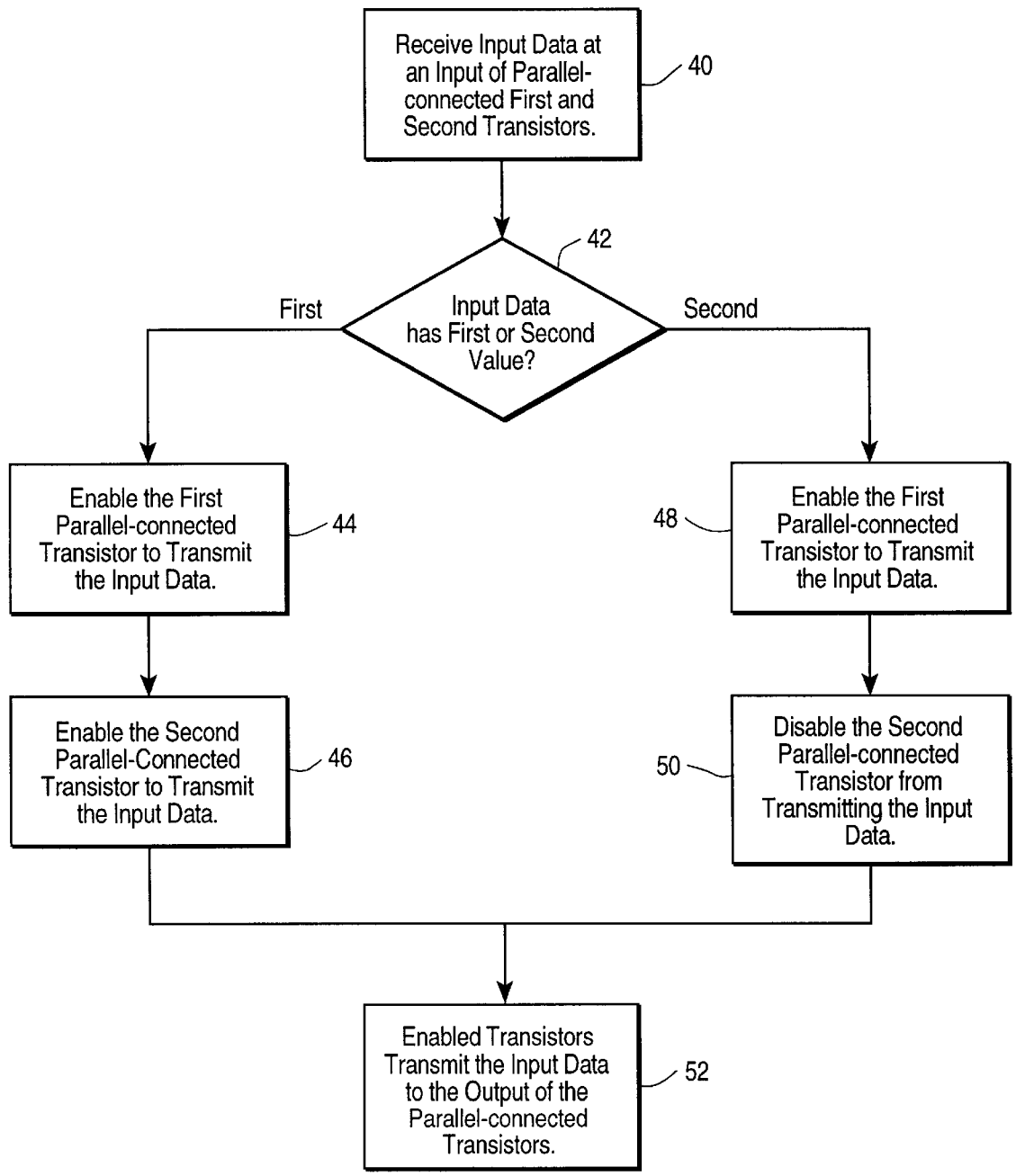
FIG_4

METHOD AND APPARATUS FOR LOW POWER DATA TRANSMISSION

BACKGROUND OF THE INVENTION

1. Field of the Invention

The present invention relates generally to circuits for selectively passing or transmitting electrical signals, and more specifically to a low power pass gate circuit for transmitting data.

2. Related Art

Today's digital integrated circuits (ICs) typically process signals and data that may have a value of either a logical 1 or a logical 0. Logical 1 represents a high voltage value (e.g., 5.0, 3.3, or 2.9 volts) while logical 0 represents a low voltage value (typically 0 volts). In the following discussion, a signal name ending with # indicates the inverted value, or opposite logical values, of a corresponding signal name without a #. For example, a CLOCK# signal is inverted with respect to the CLOCK signal. Also, a signal name without the # is typically active high while a signal name with the # is typically active low.

PN pair pass gates are widely used in CMOS (Complementary Metal Oxide Semiconductor) ICs to selectively pass, or transmit, digital data to the various circuits on the IC. A parallel-connected PN pair is used because the n-channel and p-channel transistors are especially suited for passing, or transmitting, data values of logical 0 (low voltage) and logical 1 (high voltage), respectively.

A typical PN pair pass gate circuit is designed to transmit data when the gate of the n-channel transistor is driven to the high voltage and the gate of the p-channel transistor is driven to the low voltage. In this configuration, the n-channel transistor transmits or passes logical 0 data (low voltage) from its source to drain without degradation. Similarly, the p-channel transistor transmits or passes logical 1 data (high voltage) from its source to drain without degradation.

However, due to the gate-to-source threshold voltages that are required for the transistors to conduct, n and p channel transistors do not fully transmit logical 1 (high voltage) data and logical 0 (low voltage) data, respectively. For example, a n-channel transistor only conducts or transmits data when its gate-to-source voltage, $V_{GS}$, is greater than or equal to its threshold voltage, $V_{Nt}$ (i.e., $V_{GS} \geq V_{Nt}$). Likewise, a p-channel transistor only conducts or transmits data when its source-to-gate voltage, $V_{SG}$, is greater than or equal to its threshold voltage, $V_{Pt}$ (i.e., $V_{SG} \geq V_{Pt}$). Thus, the PN pair pass gate is used to transmit digital data without degradation.

FIG. 1A illustrates the use of a PN pair pass gate in conjunction with an output latch. PN pair pass gate 12 receives an input DATA and transmits the DATA in response to a high value on the CLOCK (active high) signal. A high value in the CLOCK signal turns on the n-channel transistor of pass gate 12. When CLOCK is high, inverter 10 provides a low value to turn on the p-channel transistor of pass-gate 12. Thus, on every clock cycle both the n-channel transistor and the p-channel transistor are turned on, or enabled, to transmit the input DATA. Inverter 14 and clocked inverter 16 together form a clocked latch that latches the data transmitted by pass gate 12 when the CLOCK signal is low. Buffer 18 drives the latched data to other circuits.

FIG. 1B is a circuit corresponding to that of FIG. 1A, except the circuit of FIG. 1B is responsive to CLOCK# (active low) instead of CLOCK.

On today's complex ICs, such as microprocessors, many thousands of pass gates may be needed to control the transfer of the thousands of signals and data to the various processing units of the microprocessor. In order to reduce the setup times, the pass gate transistors must be relatively large. Therefore, the pass gate transistors have relatively large gate capacitances which must be driven by the clock signals of the IC. Thus, a large percentage of power consumed by the IC is spent charging and discharging the gate capacitance of the thousands of pass gate transistors. For example, simulations of one version of the Pentium® Pro processor available from Intel Corporation of Santa Clara, Calif., estimate that 16% of full chip power is consumed in charging and discharging the input capacitance of the PN pair pass gates as the clock toggles.

Reducing the power consumption of ICs is important for various reasons. First, high power ICs can require expensive thermal cooling solutions. Second, lower power extends the battery life of mobile computers. Since there are many thousands of pass gates on a typical IC, reducing the power consumption of the individual pass gates can achieve significant overall chip power savings.

Therefore, a method and apparatus for low power data transmission is needed.

SUMMARY OF THE INVENTION

The present invention is a method and apparatus for low power data transmission. In one embodiment the low power apparatus of the present invention receives input data having either a first or second value and selectively transmits the input data in response to a transmit signal. The low power apparatus includes an enable circuit and first and second transfer devices. The enable circuit is coupled to receive the transmit signal and the input data. The enable circuit generates an enable signal in response to the transmit signal when the input data is the first value but not when the input data is the second value. The first transfer device receives the transmit signal and the input data. The transmit signal enables the first transfer device to transmit either the first or second value input data. The second transfer device receives the enable signal and the input data. The enable signal enables the second transfer device to transmit the first value input data but not the second value input data.

BRIEF DESCRIPTION OF THE DRAWINGS

The present invention is illustrated by way of example and not limitation in the figures of the accompanying drawings, in which like references indicate similar elements.

FIG. 1A illustrates a prior art latch circuit using a PN pair pass gate.

FIG. 1B illustrates another prior art latch circuit using a PN pair pass gate.

FIG. 2A illustrates one embodiment of the low power pass gate of the present invention.

FIG. 2B is waveforms illustrating the operation of the embodiment of FIG. 2A.

FIG. 2C illustrates another embodiment of the low power pass gate of the present invention.

FIG. 2D is waveforms illustrating the operation of the embodiment of FIG. 2C.

FIG. 3A illustrates a low power gated latch embodiment of the present invention.

FIG. 3B illustrates another low power gated latch embodiment of the present invention.

FIG. 4 is a flowchart of one embodiment of the present invention method for low power data transmission.

DETAILED DESCRIPTION OF THE PRESENT INVENTION

A method and apparatus for low power data transmission is described. In the following description, numerous specific details such as specific circuits, clock signals, transistor sizes, gate capacitances, transistor types, transistor technologies, etc., are set forth in order to provide a thorough understanding of the present invention. It will be apparent, however, to one skilled in the art that the present invention may be practiced without these specific details. In other instances, well-known methods and circuits are shown in block diagram form in order not to obscure the present invention.

As discussed in the background and illustrated in FIGS. 1A and 1B, prior data transmission circuits enable both the n-channel and p-channel devices of a PN pair pass gate on every clock cycle. The prior arrangement dissipates large amounts of power in charging and discharging the gate capacitances of both pass gate transistors on every clock cycle. The present invention provides a low power transmission apparatus and method by selectively enabling only one of the PN pair pass gate transistors depending on the input data to be transmitted.

FIG. 2A illustrates one embodiment of the low power pass gate of the present invention. A pass gate 20 is coupled to receive a CLOCK (active high) signal and an EN# (active low enable) signal. Pass gate 20 includes a n-channel transistor and a p-channel transistor connected in parallel (i.e., source terminals coupled together and drain terminals coupled together). The parallel-connected transistors receive an input DATA at their common input terminal and pass, or transmit, the input DATA to their common output terminal in response to signals driven at their respective gates. The CLOCK and EN# signals are coupled to the gates of the parallel-connected n-channel and p-channel transistors, respectively, such that when the CLOCK signal is high the n-channel transistor is enabled to transmit the input DATA and when the EN# signal is low (active) the p-channel transistor is enabled to transmit the input DATA. Of course, a general purpose TRANSMIT signal can be used in place of the CLOCK signal.

An enable circuit 28 receives the CLOCK signal and the input DATA and generates the EN# signal. A p-channel transistor 22 is connected between a power supply voltage, $V_{CC}$, and the EN# signal. The p-channel transistor 22 receives the CLOCK signal at its gate terminal and drives the EN# signal high (inactive) whenever the CLOCK signal is low. Two serial-connected n-channel transistors 24 and 26 are coupled between ground and the EN# signal. N-channel transistors 24 and 26 receive the CLOCK signal and input DATA, respectively, at their respective gate terminals. Therefore, n-channel transistor 24 is enabled when the CLOCK signal is high (logical 1); n-channel transistor 26 is enabled when the input DATA is high (logical 1). Thus, n-channel transistor 24 will drive the EN# signal low (active) only when the CLOCK signal is high and the input DATA is high (logical 1). In other words, n-channel transistor 26 will prevent the EN# signal from being asserted low except when the input DATA is logical 1.

Thus, in the circuit of FIG. 2A, the n-channel transistor of pass gate 20 is enabled to transmit the input DATA on every clock cycle (when CLOCK is high) regardless of whether the input DATA is logical 0 or logical 1. However, the p-channel transistor of pass gate 20 is enabled to transmit only when the input DATA is logical 1. Since the n-channel transistor of pass gate 20 transmits logical 0 data without degradation, the p-channel transistor is not required for transmitting logical 0's. And since the n-channel transistor is usually designed to be much stronger than the p-channel, there is only a small loss of performance due to enabling only the n-channel to transmit logical 0's. Therefore, when the input DATA is logical 0, the enable signal to the p-channel is prevented to avoid unnecessary charging and discharging of the p-channel device's gate capacitance. Significant power is saved by discharging the gate of the p-channel transistor only when it is needed to pass a logical 1 without degradation (which the n-channel transistor alone cannot do).

FIG. 2B illustrates the operation of the embodiment of FIG. 2A. As shown, the EN# signal is driven low when both the CLOCK signal and the input DATA are high (logical 1). Otherwise, the EN# signal is driven high, thereby disabling the p-channel pass gate transistor. The input DATA is transmitted to the OUT node whenever the CLOCK signal is high by, depending on the input DATA value, either the n-channel alone or both the n and p channel transistors.

Since the embodiment of FIG. 2A saves power when passing logical 0 values, it is best suited for circumstances where logical 0's are transmitted most of the time. For example, as a general rule the output of an AND gate is usually a logical 0 while the output of a NAND gate is usually a logical 1.

FIG. 2C illustrates an embodiment of the low power pass gate of the present invention that saves power when transmitting logical 1's. The n-channel pass gate transistor is disabled when the input DATA is logical 1 because the p-channel pass gate transistor can transmit a logical 1, by itself, without degradation. In this embodiment, a CLOCK# signal (active low) and an EN signal (active high enable) are coupled to the gates of the p-channel and n-channel transistors of pass gate 20, respectively, such that when the CLOCK# signal is low the p-channel transistor is enabled to transmit the input DATA and when the EN signal is high the n-channel transistor is enabled to transmit the input DATA. Of course, a TRANSMIT# signal can be used in place of the CLOCK# signal.

An enable circuit 30 receives the CLOCK# signal and the input DATA and generates the EN signal. An n-channel transistor 27 is connected between ground and the EN signal. The n-channel receives the CLOCK# signal at its gate terminal and drives the EN signal low (inactive) whenever the CLOCK# signal is high. Two serial-connected p-channel transistors 25 and 23 are coupled between a power supply voltage, $V_{CC}$, and the EN signal. P-channel transistors 25 and 23 receive the CLOCK# signal and input DATA, respectively, at their respective gate terminals. Therefore, p-channel transistor 25 is enabled when the CLOCK# signal is low (logical 0); p-channel transistor 23 is enabled when the input DATA is low (logical 0). Thus, p-channel transistor 25 will drive the EN signal high (active) only when the CLOCK# signal is low and the input DATA is low (logical 0). In other words, p-channel transistor 23 will prevent the EN signal from being asserted high except when the input DATA is logical 0.

Thus, in the circuit of FIG. 2C, the p-channel transistor of pass gate 20 is enabled to transmit the input DATA on every clock cycle (when CLOCK# is low) regardless of whether the input DATA is logical 0 or logical 1. However, the n-channel transistor of pass gate 20 is enabled to transmit only when the input DATA is logical 0. Since the p-channel transistor transmits logical 1 data without degradation, the n-channel transistor is not required for transmitting logical 1's. Therefore, when the input DATA is logical 1, the enable signal to the n-channel is prevented to avoid unnecessary charging and discharging of the n-channel device's gate capacitance. Again, significant power is saved by charging the gate of the n-channel transistor only when it is needed to pass a logical 0 without degradation (which the p-channel pass gate transistor alone cannot do).

FIG. 2D illustrates the operation of the embodiment of FIG. 2A. As shown, the EN signal is asserted high (active) when both the CLOCK# signal and the input DATA are low (logical 0). Otherwise, the EN signal is low, thereby disabling the n-channel pass gate transistor. The input DATA is transmitted to the OUT node whenever the CLOCK# signal is low by, depending on the input DATA value, either the p-channel alone or both the p and n channel transistors.

Since the embodiment of FIG. 2C saves power when passing logical 1 values, it is best suited for circumstances where logical 1's are transmitted most of the time. For example, as a general rule the output of a NAND gate is usually a logical 1.

Thus, the embodiments of FIGS. 2A and 2C advantageously provide low power data transmission with the addition of a single transistor (e.g., transistors 26 and 23) that is enabled depending on the value of the input data.

Of course, the embodiments of FIGS. 2A and 2C could be combined to reduce the power when transmitting both logical 0's and 1's.

FIG. 3A illustrates a low power gated latch embodiment of the present invention. This embodiment is similar to the embodiment of FIG. 2A, described above, but adds a clocked output latch (made up of inverter 30 and clocked inverter 32) to latch the data transmitted by the pass gate 20. As described above, the pass gate 20 and enable circuit 28 operate to provide low power transmission of the input DATA when the CLOCK signal is high. Inverter 30 and clocked inverter 32 latch the transmitted data when the CLOCK signal is low. In addition to preventing unnecessary charging and discharging of the gate capacitance of the p-channel transistor of pass gate 20, the EN# signal of the embodiment of FIG. 3A also prevents unnecessary charging and discharging of the n-channel enable transistor in clocked inverter 32. Buffer 34 provides the latched data to other circuits. Similarly, FIG. 3B illustrates a low power gated latch embodiment that similarly adds a clocked output latch to the low power pass gate embodiment of FIG. 2C.

In one embodiment of FIG. 3A, the preferred channel lengths for the transistors are: 1.88 μm (X 10⁻⁶ meters) for the p-channel transistor of pass gate 20; 2.08 μm for the n-channel transistor of pass gate 20; 0.68 μm for p-channel transistor 22; 0.56 μm for n-channel transistors 24 and 26; 0.56 μm for the n and p channel transistors of inverter 30; 0.56 μm for the n and p channel transistors of clocked inverter 32.

FIG. 4 is a flowchart of one embodiment of the present invention method for low power method transmission. The method is discussed below with comments appropriate to the operation of the circuit of FIG. 2A in parentheses. The low power data transmission method selectively transmits input data through a pass gate having parallel-connected n and p channel transistors according to the following steps. In step 40, the pass gate transistors receive input data at their common input terminal. In step 42, the method determines whether the input data is a first or second logical value (e.g., logical 1 or 0). If the data is a first value (e.g., logical 1), the method proceeds to step 44 where the first transistor (e.g., n-channel pass gate transistor) is enabled (e.g., by the CLOCK signal being asserted high) to transmit the input data. In step 46, the second transistor (e.g., p-channel pass gate transistor) is enabled (e.g., by the EN# signal being asserted low when the CLOCK signal is high and the input DATA is logical 1) to transmit the input data. If in step 42, the input data has a second value (e.g., logical 0), the method proceeds to step 48 where the first transistor (e.g., n-channel pass gate transistor) is enabled to transmit the input data (e.g., by the CLOCK signal). In step 50, the second transistor (e.g., p-channel pass gate transistor) is disabled (e.g., by the EN# signal being asserted high when the input DATA is logical 0) from transmitting the input data. In step 52, the enabled transistors transmit the input data to the common output node of the parallel-connected pass gate transistors.

Thus, a method and apparatus for low power data transmission has been described.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A low power apparatus for receiving an input data having a first or second value and selectively transmitting the input data in response to a transmit signal, the low power apparatus comprising:

an enable circuit coupled to receive the transmit signal and the input data, the enable circuit to generate an enable signal in response to the transmit signal when the input data is the first value but not when the input data is the second value;

a first transfer device coupled to receive the transmit signal and the input data, the transmit signal to enable the first transfer device to transmit either the first or second value input data; and a second transfer device coupled to receive the enable signal and the input data, the enable signal to enable the second transfer device to transmit the first value input data but not the second value input data.

2. The apparatus of claim 1 wherein the first transfer device is a n-channel transistor, the second transfer device is a p-channel transistor, and the enable circuit includes a n-channel transistor coupled to the input data to prevent the enable signal except when the input data is the first value.

3. The apparatus of claim 2 wherein the first value is logical 1.

4. The apparatus of claim 1 wherein the first transfer device is a p-channel transistor, the second transfer device is a n-channel transistor, and the enable circuit includes a p-channel transistor coupled to the input data to prevent the enable signal except when the input data is the first value.

5. The apparatus of claim 4 wherein the first value is logical 0.

6. The apparatus of claim 1 wherein the apparatus further comprises:

a latch circuit coupled to the first and second transfer devices to latch the transmitted input data.

7. The apparatus of claim 2 wherein the apparatus further comprises:

a latch circuit coupled to the first and second transfer devices to latch the transmitted input data.

8. The apparatus of claim 4 wherein the apparatus further comprises:

a latch circuit coupled to the first and second transfer devices to latch the transmitted input data.

9. A low power apparatus for receiving an input data having a first or second value and selectively transmitting the input data in response to a clock signal, the clock signal having first and second states, the low power apparatus comprising:

a first transfer device coupled to receive the clock signal and the input data, the clock signal to enable the first transfer device to transmit either the first or second value input data when the clock signal is in the first state;

a second transfer device coupled to receive the input data and a second signal having an enable state and a disable state, the second signal to enable the second transfer device to transmit the first value input data when the second signal is in the enable state, the second signal to disable the second transfer device from transmitting the input data when the second signal is in the disable state; and an enable circuit coupled to receive the clock signal and the input data and generate the second signal, the enable circuit to drive the second signal to either the enable state or the disable state depending on the state of the clock signal and the input data value, the enable circuit to drive the second signal to the enable state only when the clock signal is the first state and the input data is the first value, the enable circuit to drive the second signal to the disable state when the clock signal is the second state.

10. The apparatus of claim 9 wherein the first transfer device is a n-channel transistor, the second transfer device is a p-channel transistor, and the enable circuit includes a n-channel transistor coupled to the input data to prevent the enable signal except when the input data is the first value.

11. The apparatus of claim 10 wherein the enable circuit further includes a p-channel transistor to drive the second signal to the disable state when the clock signal is in the second state, the enable circuit also includes a n-channel transistor to drive the second signal to the enable state when the clock signal is in the first state and the input data is the first value.

12. The apparatus of claim 10 wherein the first value of the input data is logical 1, the first state of the clock signal is logical 1, and the second state of the clock signal is logical 0.

13. The apparatus of claim 9 wherein the first transfer device is a p-channel transistor, the second transfer device is a n-channel transistor, and the enable circuit includes a p-channel transistor coupled to the input data to prevent the enable signal except when the input data is the first value.

14. The apparatus of claim 13 wherein the enable circuit further includes a n-channel transistor to drive the second signal to the disable state when the clock signal is in the second state, the enable circuit also includes a p-channel transistor to drive the second signal to the enable state when the clock signal is in the first state and the input data is the first value.

15. The apparatus of claim 14 wherein the first value of the input data is logical 0, the first state of the clock signal is logical 0, and the second state of the clock signal is logical 1.

16. The apparatus of claim 9 wherein the apparatus further comprises:

a latch circuit coupled to receive the clock signal and the transmitted input data, the latch circuit latches the transmitted input data when the clock signal is in the second state.

17. The apparatus of claim 11 wherein the apparatus further comprises:

a latch circuit coupled to receive the clock signal and the transmitted input data, the latch circuit latches the transmitted input data when the clock signal is in the second state.

18. The apparatus of claim 14 wherein the apparatus further comprises:

a latch circuit coupled to receive the clock signal and the transmitted input data, the latch circuit latches the transmitted input data when the clock signal is in the second state.

19. A low power method for selectively transmitting an input data having a first or second value through parallel-connected first and second transistors, the method comprising the steps of:

a) driving the input data to either the first or second value;

b) receiving the data at an input of the parallel-connected first and second transistors;

c) enabling both the first and second transistors to transmit the input data to an output of the parallel-connected first and second transistors when the input data is the first value;

d) enabling the first transistor to transmit the input data to the output of the parallel-connected first and second transistors when the input data is the second value; and e) disabling the second transistor from transmitting the input data to the output of the parallel-connected first and second transistors when the input data is the second value.

20. The method of claim 19 further comprising the step of:

f) latching the transmitted input data into a latch.

21. The method of claim 19 further comprising the steps of:

f) driving a clock signal to a first state and a second state;

g) driving a second signal to an enable state when the clock signal is in the first state and the input data is the first value;

h) driving the second signal to a disable state when the clock signal is in the second state;

i) wherein in steps c) and d) the first transistor is enabled in response to the clock signal being in the first state;

j) wherein in step c) the second transistor is enabled in response to the second signal being in the enable state; and e) wherein in step e) the second transistor is disabled in response to the second signal being in the disable state.

* * * * *